United States Patent
Bain et al.

(10) Patent No.: US 11,936,308 B2
(45) Date of Patent: Mar. 19, 2024

(54) PIXELATED ELECTROSTATIC ADHESION

(71) Applicant: THE BOEING COMPANY, Chicago, IL (US)

(72) Inventors: David M. Bain, Ashburton (AU); Brittany P. Chambers, Yeronga (AU)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 17/544,512

(22) Filed: Dec. 7, 2021

(65) Prior Publication Data

US 2023/0179123 A1    Jun. 8, 2023

(51) Int. Cl.
*H02N 13/00*    (2006.01)
*H01L 21/683*    (2006.01)

(52) U.S. Cl.
CPC ........... *H02N 13/00* (2013.01); *H01L 21/683* (2013.01); *H01L 21/6833* (2013.01); *H01L 21/6831* (2013.01)

(58) Field of Classification Search
CPC ..... H02N 13/00; H01L 21/687; H01L 21/683; H01L 21/6833; H01L 21/6831; H01L 21/68707; B25J 15/00; B25J 15/0085; B25J 15/0033
USPC ........................................................ 361/234
See application file for complete search history.

(56) References Cited

U.S. PATENT DOCUMENTS

| | | | |
|---|---|---|---|
| 2012/0134065 A1* | 5/2012 | Furuya ................ | H01L 21/6833 361/234 |
| 2014/0169924 A1* | 6/2014 | Golda .................... | H01L 33/00 414/800 |
| 2015/0298320 A1 | 10/2015 | Eisele et al. | |
| 2017/0004988 A1 | 1/2017 | Sadjadi et al. | |
| 2018/0122680 A1* | 5/2018 | Yang ................. | H01J 37/32715 |
| 2019/0240845 A1 | 8/2019 | Hart et al. | |
| 2020/0194298 A1* | 6/2020 | Lu ....................... | H01L 21/6831 |
| 2020/0313577 A1 | 10/2020 | Mici et al. | |

FOREIGN PATENT DOCUMENTS

EP    4194156 A1    6/2023

OTHER PUBLICATIONS

K. H. Koh, R. M. Kuppan Chetty and S. G. Ponnambalam, "Modeling and simulation of Electrostatic Adhesion for Wall Climbing Robot," 2011 IEEE International Conference on Robotics and Biomimetics, Karon Beach, Phuket, 2011, pp. 2031-2036, doi: 10.1109/ROBIO.2011.6181590 [Abstract Only].

J Guo et al., "Investigation of relationships between interfacial electroadhesive force and surface texture," 2016 J. Phys. D: Appl. Phys. 49 035303.

(Continued)

*Primary Examiner* — Danny Nguyen
(74) *Attorney, Agent, or Firm* — Patterson + Sheridan, LLP

(57) ABSTRACT

Certain aspects of the present disclosure provide an apparatus for grasping an object. The apparatus includes a substrate comprising a plurality of electrode pixels; and a controller configured to energize each electrode pixel of the plurality of electrode pixels individually, wherein the apparatus is configured to grasp an object electrostatically using the substrate.

15 Claims, 10 Drawing Sheets

(56) References Cited

OTHER PUBLICATIONS

Brecher, C. & Kukla, Christian & Schares, Richard & Emonts, M.. (2015). Electrostatic grippers for lightweight productions—Form- and area-adaptive electrostatic gripper systems for high-performance materials. WT Werkstattstechnik. 105. 567-572.

European Patent Office, Notification of European Publication No. And Information on the Application of Article 67(3) EPC for Application 22193817.8-1002 dated May 17, 2023.

European Patent Office, extended European Search Report for Application 22193817.8-1002 dated Apr. 26, 2023.

Zhang et al., Modeling and Analysis of Electrostatic Force for Robot Handling of Frabric Materials, IEEE/ASME Transactions on Mechatronics, vol. 4, No. 1, Mar. 1999, pp. 39-49.

* cited by examiner

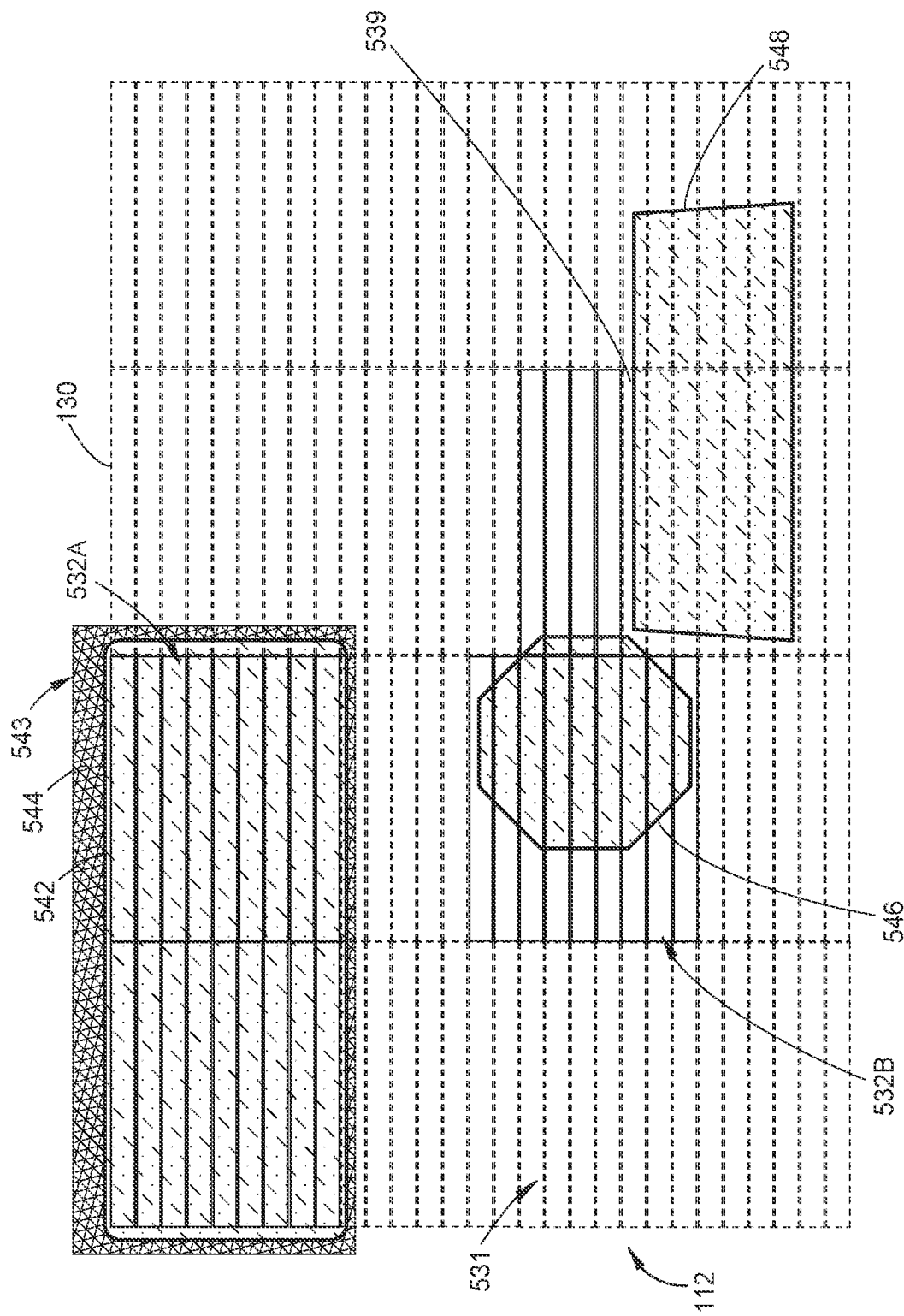

PIXELATED ELECTROSTATIC ADHESION

FIELD

Aspects of the present disclosure relate to a system for grasping an object.

BACKGROUND

Movement of objects, such as parts and material, is an important part of production and assembly processes. Conventional systems and methods for moving objects are limited in their capability or may not be suitable for certain production processes such as moving thin or delicate materials. Keeping with this example, the delicate materials may be moved using manual or automated handling. Manual handling includes moving the materials with an operator or operators, which is a cumbersome process that may damage the material. Automated handling includes robotic systems with a vacuum end effector. Vacuum-based systems require a vacuum be maintained for each area of the material the end effector contacts. Each vacuum that is maintained is limited by an output of a vacuum source, such as a vacuum pump. The vacuum source is very loud and requires a large amount of energy to generate each required vacuum. Further, vacuum-based systems are not suitable for moving delicate material because the vacuum may damage the material by exerting a force on the material that is higher than the force the material can withstand.

Accordingly, there is a need for an improved system for moving objects that can selectively grasp and move the objects without damaging the objects or grasping unwanted nearby objects.

SUMMARY

Certain embodiments provide an apparatus for grasping an object. The apparatus includes a substrate comprising a plurality of electrode pixels and a controller configured to energize each electrode pixel of the plurality of electrode pixels individually. The apparatus is configured to grasp an object electrostatically using the substrate.

Other aspects provide a method for grasping an object electrostatically. The method includes grasping an object via a substrate comprising a plurality of electrode pixels and selectively energizing each electrode pixel of the plurality of electrode pixels via a controller.

Other aspects provide processing systems configured to perform the aforementioned method as well as those described herein; non-transitory, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more embodiments.

DESCRIPTION OF THE DRAWINGS

The appended figures depict certain aspects of the one or more embodiments and are therefore not to be considered limiting of the scope of this disclosure.

FIGS. 5A and 5B depict a subset of electrode pixels configured to grasp different objects, according to an example of the present disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Figure 1A:
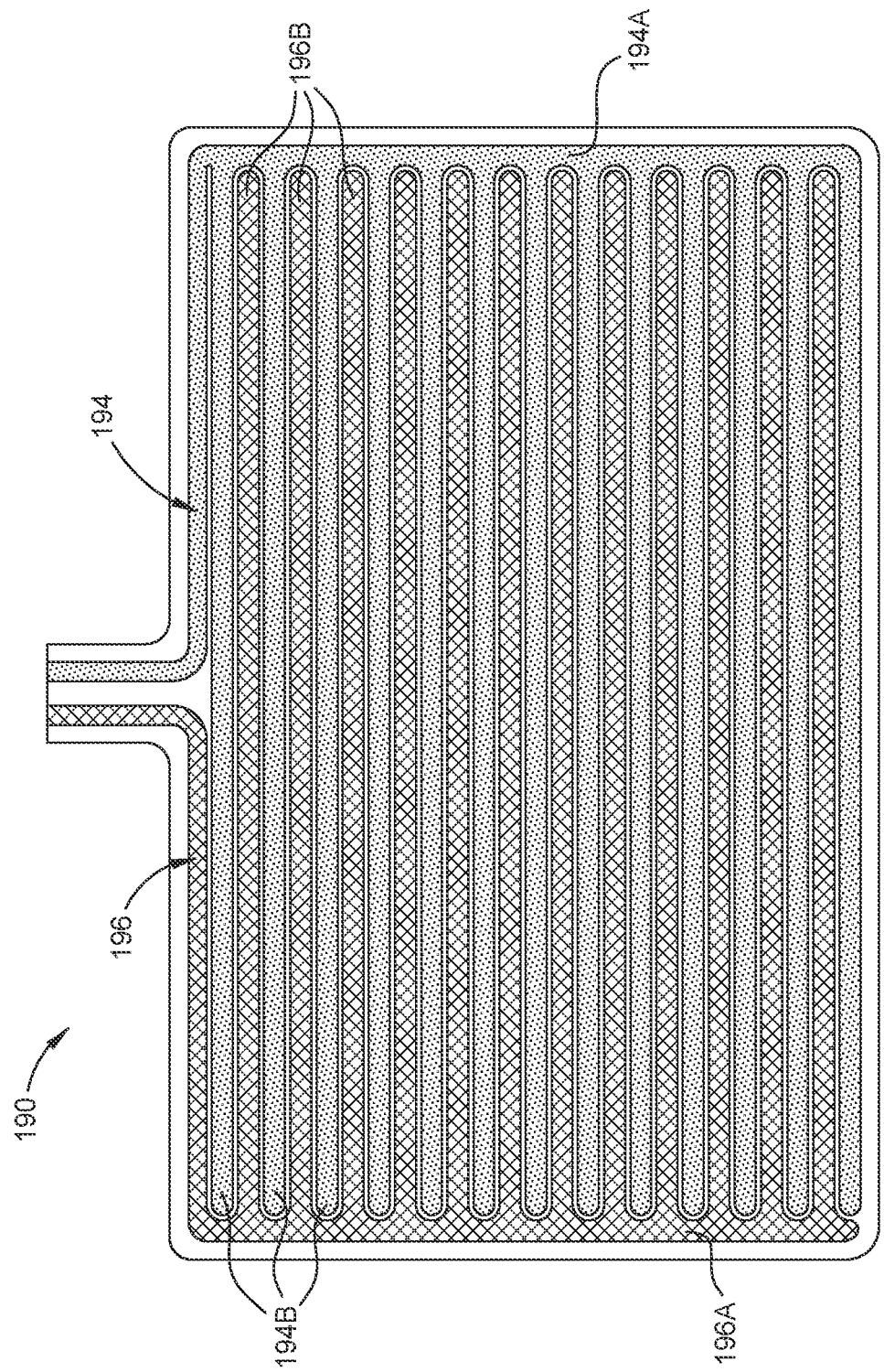
FIG. 1A depicts a conventional electrostatic adhesion system for grasping an object.

Aspects of the present disclosure provide a system for selectively grasping and moving objects, such as a material or parts, without damaging the objects or grasping unwanted nearby objects.

Typically, objects may be moved using manual or automated handling. For example, pick and place of materials, such as a dry carbon fiber ply, may be done through manual handling. An operator, or multiple operators if the ply is large, will carefully pick up the dry carbon fiber ply from a ply cutter. The ply may be picked out from within a scrap material "skeleton". The operator or operators will then transport the ply to a different location, such as a subsequent tool or a storage location. However, manual handling is a slow process, requires human operators, and can damage the ply if the ply is not handled carefully.

Automated handling may also be used to pick and place a carbon fiber ply. For example, an end effector may be used with a robotic system, such as a gantry or arm. The end effector may include a vacuum system that has discrete vacuum cups in either a grid or an optimized position layout to compliment known ply shapes that will be picked. The robotic system positions the end effector over the ply, turns on the vacuum cups, and picks up and moves the ply. The vacuum system works well for stiffer materials such as dry twills, multiaxials, and prepregs, but may damage more delicate or less stiff materials, such as dry non-crimp fabric (NCF) unidirectional materials. For example, the vacuum system may damage a unidirectional NCF such as a dry carbon fiber ply. Delicate materials require several vacuum cups arranged to compliment the boundary of the ply and to stop the ply edge from folding over or being damaged. Vacuum-based systems have several other drawbacks. The systems are heavy, require a large amount of energy to generate a required vacuum, are difficult to miniaturize to allow discrete control of small areas, can suck up fibers that clog ports within the system, are noisy, and require the vacuum exhaust air to be filtered in controlled contamination area (CCA) rooms.

Another example of automated handling uses an end effector that includes an electrostatic system to pick and place the ply using electrostatic adhesion. Electrostatic-based systems require a high amount of voltage and use a pad and electrostatic energy to "grasp" the material. The electrostatic system includes electrodes as part of the pad to generate an electrostatic field using an alternating open circuit of positive and negative electrode pairs. The electrode pairs are embedded in a dielectric medium or material of the pad and connected to a high voltage power source. Conventional electrostatic systems use a comb-like electrode layout as part of the pad, where the positive and negative electrodes are interdigitated as discussed in relation to FIG. 1A. The power source forms an electrostatic field through the opposing positive and negative charges of the electrode pairs. When the pad is placed near the ply, the electrostatic field temporarily polarizes a corresponding region of the ply at an atomic level and generates an electrostatic force between the ply and the electrode pairs. For example, when the pad is placed near the ply, the charges of various regions of the ply are rearranged (e.g., polarized) such that the positive charges in the ply are attracted to the negative electrode and the negative charges in the ply are attracted to the positive electrode.

Electrostatic systems have several benefits. For example, electrostatic systems are nearly silent, are solid state, require significantly less power than vacuum-based systems, and do not require air filtration. Electrostatic adhesion may be used with conductive and non-conductive materials. Electrostatic systems can further be manufactured using standard printed circuit board (PCB) methods, which beneficially makes them more cost effective when compared to manual handling or vacuum-based systems. However, conventional electrostatic designs have drawbacks. For example, the conventional systems must use the entire pad to pick up the ply, as the pad does not have discrete zones of electrodes that can be turned on and off individually to control the adhesion. Use of the entire pad is problematic when only a portion of a ply must be picked up. For example, a ply cutter may cut the portion of the ply from a ply sheet. Keeping with this example, the cut portion of the ply must be picked up while the scrap material skeleton of the ply sheet is left behind. However, a conventional system that uses the entire pad to pick up a ply cannot be used to pick up the cut portion of the ply and leave the skeleton when the pad is larger than or extends past a boundary or perimeter of the cut portion of the ply. Further, the conventional systems cannot use multiple pads to create discrete zones because when a pad of the multiple pads is not energized, a large "dead zone" the size of the conventional pad would result. The large dead zone would limit the ability to pick up objects.

Conventional electrostatic systems have additional disadvantages. For example, the conventional systems require significant voltage levels (e.g., about 2,000-4,000V) to generate enough electrostatic adhesion to pick up the ply. Conventional electrostatic systems grasp any material that contacts the pad or comes within a set distance from the pad (collectively referred to as contacts the pad). Thus, conventional electrostatic-based systems cannot selectively grasp an object that contacts the pad while not grasping other objects that contact the pad. Additionally, the comb-like layout allows the ply to slide when the robotic system moves, which is undesirable because the sliding may damage the ply or the ply may slide off the electrode pad.

The improved pixelated electrostatic adhesion system described herein addresses these issues by using discrete zones of electrodes that can be selectively powered or energized. The electrodes of the zones may be referred to as electrode pixels.

Example Conventional Electrostatic Adhesion System for Grasping an Object

FIG. 1A depicts one example of a conventional electrostatic adhesion system for grasping an object.

The system includes an electroadhesive pad 190 that is used to grasp an object. The electroadhesive pad 190 has one negative electrode 194 and one positive electrode 196. Each electrode 194 and 196 has a comb-like shape. For example, the positive electrode 196 includes a shaft 196A and teeth 196B (three of which are labeled) extending outward from the shaft 196A. The teeth 196B and the shaft 196A form a continuous shape, and thus a continuous electrode, such that when a positive voltage is applied to the positive electrode 196, the positive voltage is applied to both the shaft 196A and the teeth 196B portions of the positive electrode 196. The negative electrode 194 is configured similarly with a shaft 194A and teeth 194B and a negative voltage.

Example Pixelated Electrostatic Adhesion System for Grasping an Object

Figure 1B:
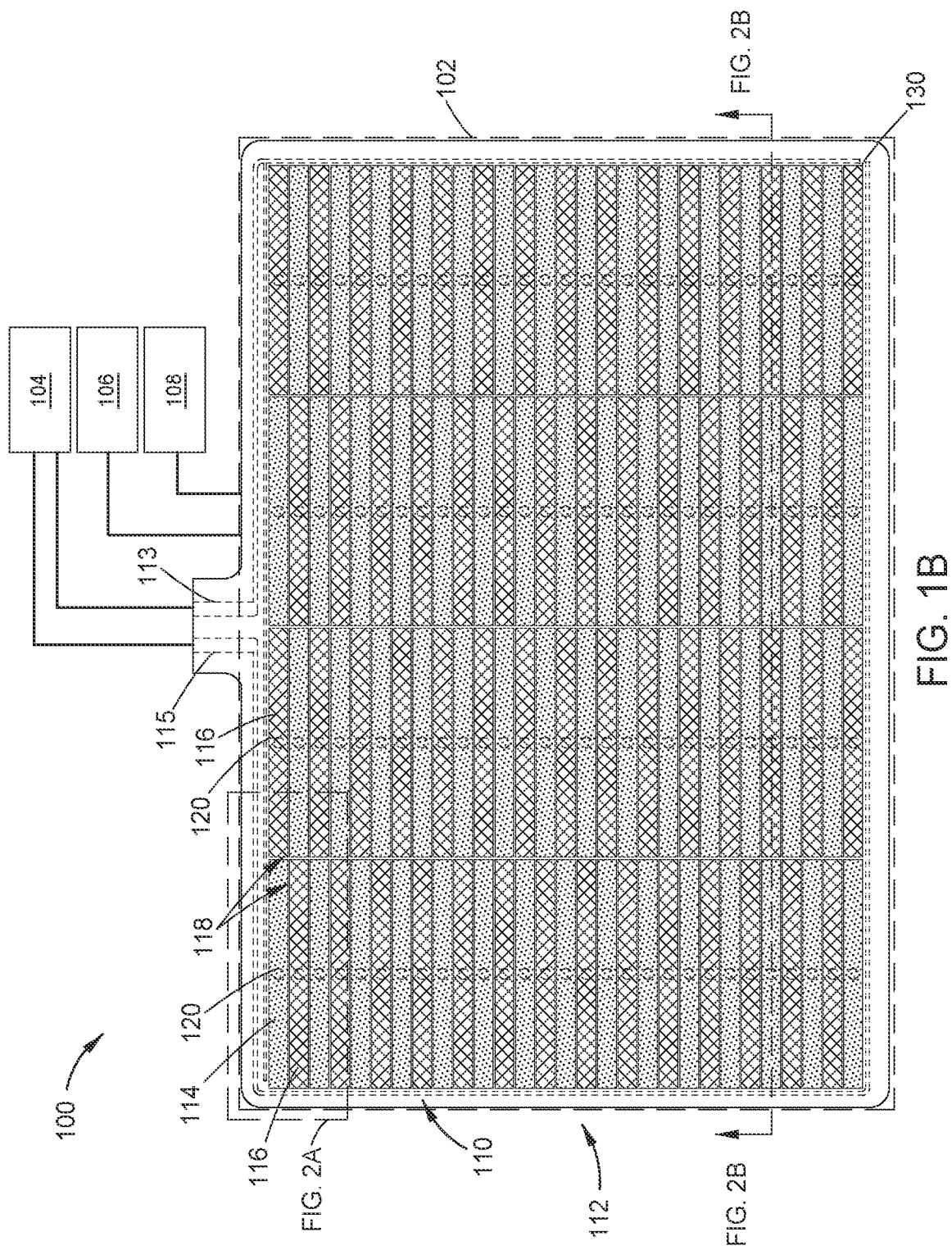
FIG. 1B depicts a pixelated electrostatic adhesion system for grasping an object, according to an example of the present disclosure.

FIG. 1B depicts a pixelated electrostatic adhesion system 100 for grasping an object, according to an example of the present disclosure.

The pixelated electrostatic adhesion system 100 (referred to as the system 100) includes an apparatus, such as a pixelated pad 102, for grasping an object. The pixelated pad 102 is configured to grasp an object electrostatically using a substrate 110. The substrate 110 comprises a plurality of electrode pixels 112. In the depicted embodiment, the plurality of electrode pixels 112 includes a plurality of negative electrode pixels 114 (one of which is labeled) and a plurality of positive electrode pixels 116 (two of which are labeled). In this example, each respective electrode pixel of the plurality of electrode pixels 112 is adjacent to at least two other electrode pixels of the plurality of electrode pixels 112. The at least two other electrode pixels have a polarity opposite the respective electrode pixel. For example, a negative electrode pixel 114 is adjacent to at least two positive electrode pixels 116. Thus, the plurality of electrode pixels 112 are arranged in a grid pattern, or a checkerboard pattern, of alternating polarities among adjacent electrode pixels. The grid pattern of the plurality of electrode pixels 112 beneficially allows the system 100 to selectively power or energize discrete zones or subsets of electrode pixels 114 and 116 as described in relation to FIGS. 5A and 5B.

The electrode pixels 114 and 116 shown in FIG. 1B are just one example of how each pixel of the plurality of electrode pixels 112 may be configured. In some embodiments, the plurality of electrode pixels 112 may be configured differently such that each pixel of the plurality of electrode pixels 112 may be set to a different polarity than shown in FIG. 1B. For example, the polarities of the electrode pixels 112 may be configured to be reversed from what is shown in FIG. 1B such that the electrode pixels shown as the negative electrode pixels 114 may instead be the positive electrode pixels 116 and the electrode pixels 112 shown as the positive electrode pixels 116 may instead be the negative electrode pixels 114. In some embodiments, the plurality of electrode pixels 112 may be configured to include only negative electrode pixels or only positive electrode pixels. In some embodiments, such as discussed in relation to FIG. 4A, the plurality of electrode pixels 112 may be set such that the electrode pixels 114 and 116 are arranged in a different pattern (e.g., not a checkerboard pattern). In some embodiments, the plurality of electrode pixels 112 may be configurable such that each pixel of the plurality of electrode pixels 112 may be set to a positive or negative polarity or no polarity (e.g., not powered or energized). For example, the polarity of the electrode pixels 112 may be set to the negative and positive electrode pixels 114 and 116 shown in FIG. 1B to grasp or pick up an object with the pixelated pad 102. When the object is released, the polarities of the plurality of electrode pixels 112 may be reversed to repel the object from the pixelated pad 102. Thus, the discussion of the system 100 in FIG. 1B is not meant to limit the arrangement or configuration of the plurality of electrode pixels 112 to the arrangement shown in FIG. 1B.

As shown, the plurality of electrode pixels 112 comprises a rectangular perimeter 130. In some embodiments, the perimeter 130 may be a different shape such as a circle, semi-circle, triangle, square, arc, arch, or other polygonal shape as discussed in relation to FIGS. 4B and 4C. Each electrode pixel of the plurality of electrode pixels 112 (referred to as electrode pixels 114 and 116) is separated from any adjacent electrode pixel of the plurality of electrode pixels 112 by a gap 118. For example, the gap 118 separates the negative electrode pixel 114, which is located at a corner of the pixelated pad 102, from the two adjacent positive electrode pixels 116. Keeping with this example, a negative electrode pixel 114 located in the center of the pixelated pad is adjacent to four positive electrode pixels 116. A gap 118 separates the negative electrode pixel 114 from the adjacent positive electrode pixels 116. The grid pattern of the plurality of electrode pixels 112 and the gaps 118 between electrode pixels 114 and 116 provide more opposed electrode pixels (e.g., positive to negative) than conventional electrostatic adhesion systems. For example, the conventional electrostatic adhesion system discussed in relation to FIG. 1A has two opposed, interdigitated electrodes (e.g., a positive electrode and a negative electrode) with a gap in between. The interdigitated electrodes form opposed electrodes along each interlocked joint.

The system 100 generates an electrostatic field at each set of opposed electrode pixels 114 and 116. When used to pick up an object, each electrostatic field creates an adhesion force by rearranging (e.g., polarizing) charges of the object such that the positive charges in the object are attracted to the negative electrode and the negative charges in the object are attracted to the positive electrode. Thus, the pixelated pad 102 of the system 100 is an improvement over the conventional system discussed in relation to FIG. 1A because the improved system 100 has more opposed electrodes, which generate more electrostatic fields than the conventional system, which in turn may increase the adhesion force.

Further, the system 100 is an improvement over the conventional system because the improved system 100 can more reliably pick up objects with anisotropic electrical properties at different alignment angles. For example, the improved system 100 may pick up the anisotropic dry carbon ply when the plurality of electrode pixels 112 are aligned with (e.g., placed at a 0 degree angle from) the length of the strands of carbon of the carbon fiber ply. When aligned, the plurality of electrode pixels 112 create polarized regions along a length of the tows, rather than allowing a current to flow along the conductive length of the strands of carbon. Thus, the improved system 100 can reliably pick up objects with anisotropic electrical properties, regardless of the alignment of the plurality of electrode pixels 112.

A power source (not shown) powers the pixelated pad 102. The power source includes a negative voltage input 113 and a positive voltage input 115. The voltage inputs 113 and 115 are shown as dashed because they are on an opposite side of the substrate 110 than the plurality of electrode pixels 112 and are hidden from view in the perspective of FIG. 1B. In some embodiments, the substrate 110 may comprise multiple layers. Thus, any reference to the substrate 110 may refer to all layers of the substrate 110 and any reference to a "side" of the substrate 110 is generally made in relation to the substrate as a whole, where one side may be a top or upper layer and another side may be a bottom or lower layer. The negative voltage input 113 connects to the negative electrode pixels 114 and the positive voltage input 115 connects to the positive electrode pixels 116 through a plurality of vias 120 in the substrate 110, as further described in relation to FIGS. 2A-3. The vias 120 are shown as dashed circles on the electrode pixels 112 to illustrate that they are hidden from view in the perspective of FIG. 1B.

The system 100 further comprises a controller 104, a motion system 106, and a distance measurement system 108. The controller 104 is configured to energize electrode pixels 114 and 116 individually. For example, the controller 104 may selectively power discrete zones of electrode pixels 114 and 116 or individual electrode pixels as described in relation to FIGS. 5A and 5B. The controller 104 may also power the entire plurality of electrode pixels 112. In some embodiments, the controller 104 may selectively energize each pixel of the plurality of electrode pixels 112 as a negative electrode pixel 114, a positive electrode pixel 116, or no polarity (e.g., not powered or energized) as previously discussed.

The motion system 106 is configured to position the substrate adjacent to the object to be grasped. For example, the motion system 106 may include a robotic system, such as a gantry or arm that attaches to the pixelated pad 102 and uses the pixelated pad 102 as an end effecter. The controller 104 may be configured to control movement of the motion system 106.

The distance measurement system 108 is configured to measure a distance between a part of the pixelated pad 102, such as the substrate 110, and the object to be grasped. For example, the distance measurement system 108 may be used to position the substrate 110 a predetermined distance away from the object before the motion system 106 moves the pixelated pad 102 to contact the object. The distance measurement system 108 may be used to determine if the pixelated pad 102 contacts the object before energizing the pixelated pad 102, which beneficially avoids a partial pull up of the object as the motion system 106 moves the pixelated pad 102 into place and prevents damage to the object (e.g., a dry carbon fiber ply). In certain embodiments, a part of the pixelated pad 102 may contact the object when the substrate 110 is at the predetermined distance away from the object because the electrode pixels 112 may protrude from the substrate 110. Positioning the pixelated pad 102 before energizing also prevents the system 100 from affecting other objects, such as a scrap material skeleton surrounding a portion of the ply to be picked up that was cut from a ply sheet. The distance measurement system 108 may be further configured to determine an orientation of the pixelated pad 102 in relation to the object. For example, the distance measurement system 108 may determine a shape of the object to be grasped electrostatically.

The distance measurement system 108 may determine how the pixelated pad 102 should be rotated or translated in three-dimensional space to align the pixelated pad 102 to the object based on the shape of the object. Aligning the pixelated pad 102 beneficially allows the pixelated pad 102 to be positioned such that a subset of the plurality of electrode pixels 112 may be energized to selectively pick up the object as described in FIGS. 5A and 5B. The controller 104 may be configured to interface with the distance measurement system 108 and use data (e.g., measurements) received from the distance measurement system 108 to control movement of the motion system 106. The controller 104 may be further configured to energize a subset of electrode pixels of the plurality of electrode pixels 112 based on the shape of the object determined by the distance measurement system 108. For example, the controller 104 may energize the subset of electrode pixels based on a perimeter of the shape of the object. The distance measurement system 108 may include at least one of a laser, ultrasonic, photoelectric, or optical measurement systems. The distance measurement system 108 may also include one of a position sensor such as an encoder or angular sensor to sense a position or angle of the object or the pixelated pad 102. Additional sensors, such as described in relation to FIG. 7, may be used to sense positions or angles.

The different systems and sensors beneficially provide data associated with the position of the pixelated pad 102 in relation to the object. In some embodiments, the systems and sensors may be part of another system. For example, the sensors may include encoders that are integrated in a robot arm of the motion system 106.

In some embodiments, the substrate 110 is flexible, or includes flexible or articulable portions, which beneficially allows the pixelated pad 102 to conform to a non-planar shape of the object. For example, the substrate 110 may be used to pick up a dry carbon fiber ply from a table with a contour or a piece of carbon fiber that is already formed. The flexible substrate 110 allows the pixelated pad 102 to flex to match the contour of the table, reducing an amount of air gaps between the pixelated pad 102 and the ply. The reduction in air gaps beneficially increases the adhesive force exerted by the pixelated pad 102. In some embodiments, the substrate 110 is a printed circuit board (PCB) or a flexible PCB. In some embodiments, the plurality of electrode pixels 112 may be secured to substrate 110 through various means including adhesive or solder, or may be formed as a layer of the substrate 110.

Examples of Pixelated Pads for Grasping an Object

Figure 2A:
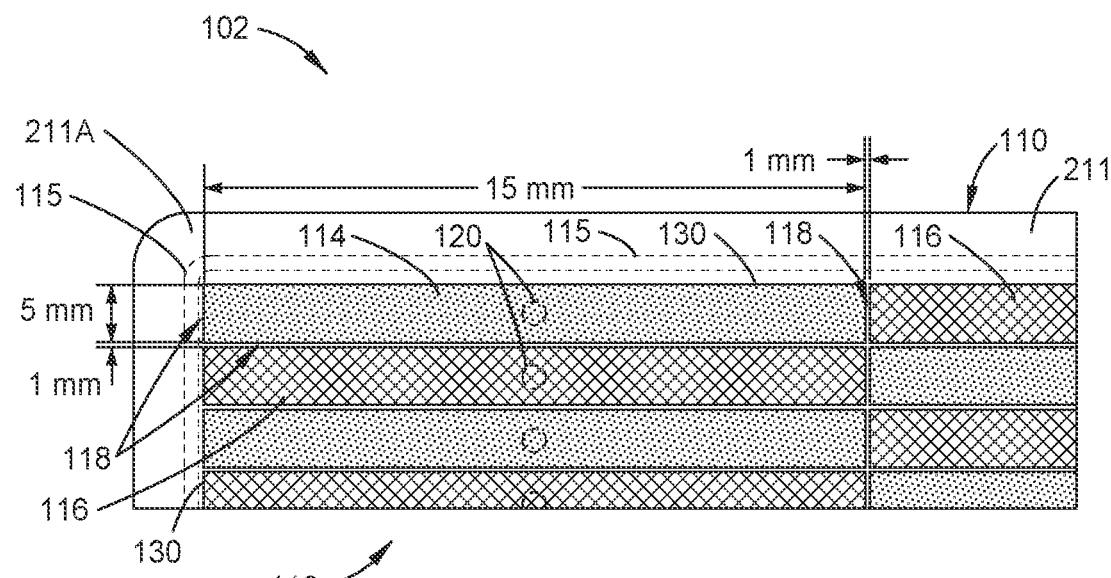
FIG. 2A depicts a partial top plan view the pixelated electrostatic adhesion system from FIG. 1, according to another example of the present disclosure.

FIG. 2A depicts a partial top plan view of the pixelated electrostatic adhesion system 100, according to another example of the present disclosure. In particular, FIG. 2A shows a close up of the plurality of electrode pixels 112 and the gap 118 between the electrode pixels 114 and 116.

Figure 2B:
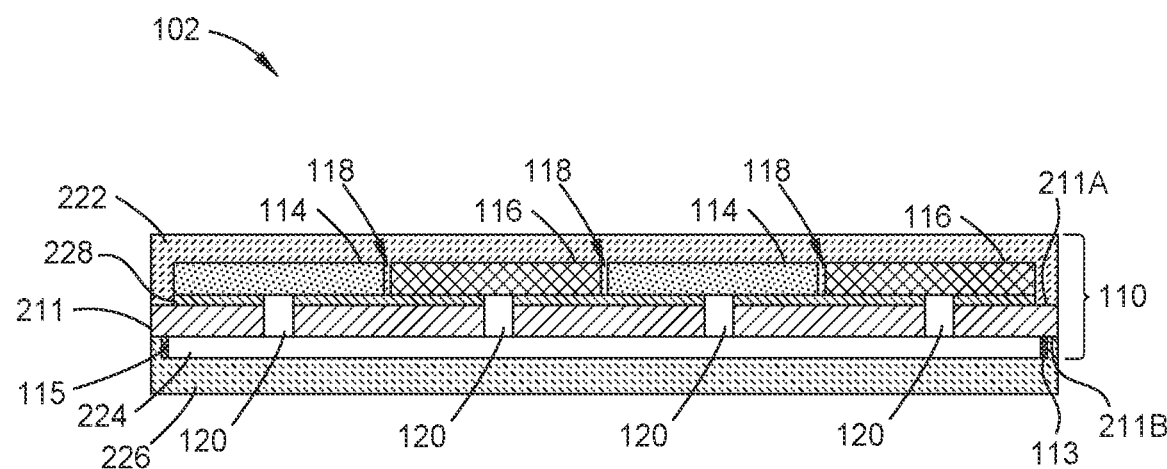
FIG. 2B depicts a side cross-sectional view of the pixelated electrostatic adhesion system from FIG. 1, according to another example of the present disclosure.

The plurality of electrode pixels 112 are arranged on an upper side of the substrate 110, where "upper" is in relation to the orientation shown on the page in FIG. 2B. For example, the plurality of electrode pixels 112 are arranged on a first side 211A of a core layer 211 of the substrate 110. The core layer 211 is further discussed in FIG. 2B. The electrode pixels 114 and 116 may vary in size or shape. In the depicted embodiment, the electrode pixels 114 and 116 are rectangular in shape and measure approximately 5 mm×50 mm in size. In some embodiments, the electrode pixels 114 and 116 may be 5 mm×15 mm. In some embodiments, different dimensions may be used for the electrode pixels 114 and 116. In relation to the measurements of the shape of the electrode pixels 114 and 116, "approximately" may mean within plus or minus 1 mm. In other embodiments, the electrode pixels 114 and 116 may be a different shape, such as discussed in relation to FIGS. 1B, 4B, and 4C. The size of the gap 118 in the depicted embodiment is generally no more than approximately 1 mm, although other gap sizes may be used in some embodiments. Generally speaking, as the size of the gap 118 decreases, the resulting adhesion force increases. Thus, a gap size of approximately 1 mm or less beneficially increases the adhesion force of the pixelated pad 102 when compared to larger gap sizes used in conventional electrostatic adhesion systems. In relation to the size of the gap 118, "approximately" may mean within plus or minus 10 percent. In some embodiments, the size of the gap 118 may be no more than approximately 2 mm. The vias 120 are shown as dashed circles on the plurality of electrode pixels 114 and 116 to illustrate that they are hidden from view in the perspective of FIG. 2A (such as shown in FIG. 2B). In some embodiments, the vias 120 may be positioned at another location, such as at an edge of each electrode pixel 114 and 116. In some embodiments, the vias 120 may extend through the electrode pixels 114 and 116 as through holes.

FIG. 2B depicts a side cross-sectional view of the pixelated electrostatic adhesion system 100, according to another example of the present disclosure. In particular, FIG. 2B shows different layers of the pixelated pad 102.

As previously discussed, the plurality of electrode pixels 112 (e.g., electrode pixels 114 and 116) are arranged on a first side 211A of the core layer 211 of the substrate 110. The core layer 211 may function as a bonding layer, insulating layer, or structural support layer for the substrate 110. In some embodiments, the core layer 211 may comprise a dielectric medium such as at least one of glass or polymers such as polytetrafluoroethylene (PTFE), polypropylene, and polyethylene and the like. For example, the core layer 211 may be an acrylic wafer.

A dielectric layer 222 is disposed over the electrode pixels 114 and 116 such that the dielectric layer 222 is positioned in between the electrode pixels 114 and 116 and the object to be grasped. The dielectric layer 222 may be thin enough such that the dielectric layer 222 does not reduce the electrostatic field of the electrode pixels 114 and 116. The thickness of the dielectric layer 222 may vary depending on the dielectric medium. Further, the dielectric layer 222 comprises a dielectric medium or material, such as previously discussed, and may be disposed in the gaps 118. In some embodiments, the dielectric layer 222 comprises a different dielectric medium than the core layer 211. In some embodiments, the dielectric layer 222 comprises polyimide or a fiberglass prepreg. In some embodiments, the dielectric layer 222 is air surrounding the electrode pixels (e.g., ambient air) and is not actually a contained layer, which beneficially allows bare electrode pixels 114 and 116 to be used to grasp non-conductive materials.

As shown in FIG. 2B, a plurality of conductive control traces 224 are arranged on a different layer than the electrode pixels 114 and 116. The plurality of conductive control traces 224 may be arranged on a lower side of the substrate 110, where "lower" is in relation to the orientation shown on the page in FIG. 2B. For example, the plurality of conductive control traces 224 may be arranged on a second side 211B of the core layer 211 of the substrate 110, where the second side 211B is an opposite side of the core layer 211 than the first side 211A. Each of the electrode pixels 114 and 116 is connected to a conductive control trace of the plurality of conductive control traces 224 by a via 120 in the substrate 110. As shown in FIG. 2B, the voltage inputs 113 and 115 are positioned on the second side 211B of the core layer 211 and connect to the conductive control traces 224.

In some embodiments, the voltage inputs 113 and 115 and/or the conductive control traces 224 are positioned at a different location or locations. For example, the substrate 110 may comprise a plurality of layers. The voltage inputs 113 and 115 and the conductive control traces 224 may each be positioned on a different layer or in between two different layers of the plurality of layers of the substrate 110. The negative voltage inputs 113 and the positive voltage inputs 115 may be positioned such that the voltage inputs 113 and 115 are not positioned on or in between the same layer of the substrate 110. The conductive control traces 224 may also be positioned such that different conductive control traces of the conductive control traces 224 are not positioned on or in between the same layer. Thus, the voltage inputs 113 and 115 and the conductive control traces 224 may be split between the layers. In some embodiments, the vias 120 may not form a through hole through all the layers of the substrate and may instead form an opening through some of the layers of the substrate.

In some embodiments, the voltage inputs 113 and 115 may connect to the electrode pixels 114 and 116 by a PCB that is separate from the substrate 110. For example, a PCB may include the voltage inputs 113 and 115 and the plurality of conductive control traces 224, each of the vias 120 of the substrate 110 may terminate in a socket or a pin, and the PCB may be configured to connect the conductive control traces 224 to the sockets or pins of the vias 120. The PCB may allow the conductive control traces 224 to be re-configured by a removable PCB. The removable PCB beneficially allows the voltage inputs 113 and 115 to supply the electrode pixels 114 and 116 through different configurations. By way of example, one configuration may supply a voltage input 113 or 115 to each electrode pixel of the electrode pixels 114 and 116. Another configuration may supply a voltage input 113 or 115 to different regions or zones of the electrode pixels 114 and 116. In some embodiments, the controller may be coupled to the removable PCB and configured to supply the voltage inputs 113 and 115 to the electrode pixels 114 and 116.

In one example, each electrode pixel of the plurality of electrode pixels 112 is configured to be energized in a range of magnitudes of voltages between 0V and 4,000V. In another example, each electrode pixel of the plurality of electrode pixels 112 is configured to be energized in a range of magnitudes of voltages between 0V and 1,500V. In some embodiments, other magnitudes of voltages may be used to energize the plurality of electrode pixels 112. The voltage inputs 113 and 115 may be controlled by the controller 104, as discussed in relation to FIGS. 1B and 7, or a controller connected to the power source. The conductive control traces are further discussed in relation to FIG. 3.

The pixelated pad 102 may include at least one heating element 228. The at least one heating element 228 is configured to heat the dielectric layer 222, which beneficially increases the adhesion force as observed in experiments. The heating element 228 is shown as located between the electrode pixels 114 and 116 and the core layer 211 and is configured to heat the dielectric layer 222 through the electrode pixels 114 and 116 by conduction. The vias 120 may further extend through the at least one heating element 228 and the at least one heating element 228 may connect to a conductive control trace of the conductive control traces 224 through one or more of the vias 120. In some embodiments, the heating element 228 may be configured to heat discrete zones of electrode pixels 114 and 116, individual electrode pixels, or the entire plurality of electrode pixels 112. For example, the heating element 228 may comprise a plurality of heating elements 228 and each heating element of the plurality of heating elements 228 may correspond to and may be placed behind a zone or a region of the electrode pixels 114 and 116. Each heating element of the plurality of heating elements 228 may also be placed behind an individual electrode pixel of the electrode pixels 114 and 116 and/or in the gaps 118. In some embodiments, the heating element 228 may be located between different layers of the pixelated pad 102 than shown in FIG. 2B. In some embodiments, the heating element 228 may not be located in between the electrode pixels 114 and 116 and the object to be grasped.

In some embodiments, such as embodiments where the substrate 110 comprises a plurality of layers (referred to as a multi-layer substrate), the dielectric layer 222, the electrode pixels 114 and 116, the gaps 118, the at least one heating element 228, the core layer 211, the voltage inputs 113 and 115, and the conductive control traces 224 may each form at least one layer of the plurality of layers of the substrate 110. For example, the electrode pixels 114 and 116 and the gaps 118 may form at least one layer of the substrate 110. The conductive control traces 224 may form a different layer of the substrate 110. The vias 120 may connect the conductive control traces 224 to the electrode pixels 114 and 116 by through-hole vias, blind vias, and/or buried vias. In some embodiments, the multi-layer substrate may include at least one prepreg layer that may bind together different layers of the multi-layer substrate. The core layer 211 may also include one or more prepreg layers. In some embodiments, the multi-layer substrate comprises dielectric layers between each layer containing the electrode pixels 114 and/or 116. The dielectric layers protect each conductive layer containing the electrode pixels 114 and 116 from arcing to another conductive layer. In some embodiments, the multi-layer substrate may only comprise dielectric layers and electrode pixel layers. For example, the layers of the multi-layer substrate may be arranged as dielectric-electrode pixel-dielectric-electrode pixel-dielectric and so forth. The dielectric-electrode pixel multi-layer substrate may further interface with a removable PCB configured to supply the voltage inputs 113 and 115 to the electrode pixels by the vias as previously discussed.

Figure 7:
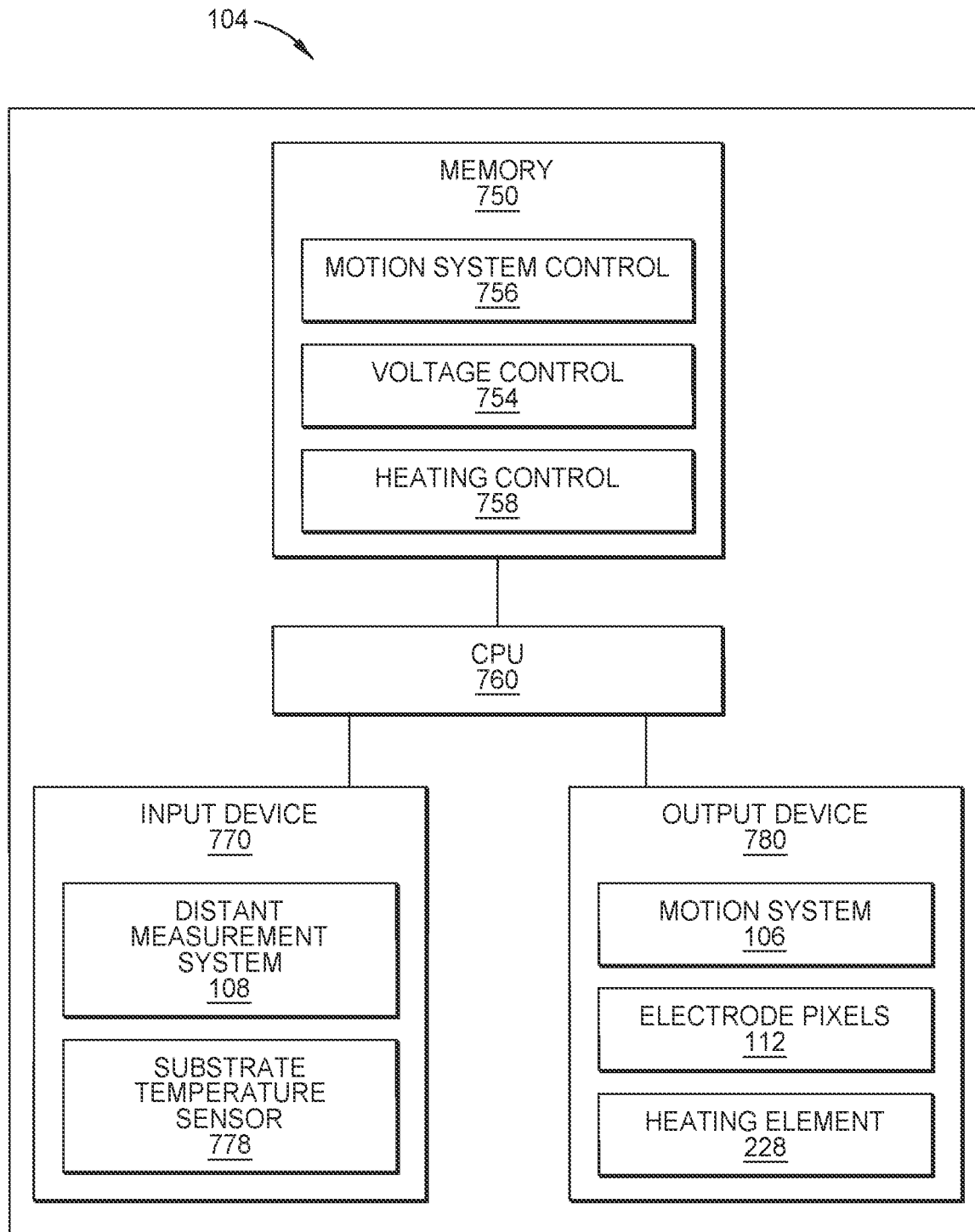
FIG. 7 depicts a schematic view of an example system controller that can be used according to the systems and methods described herein.

Some embodiments further include a temperature sensor, such as a thermocouple, to sense a temperature of the heating element 228 or of another part of the pixelated pad 102, as discussed in relation to FIG. 7. The temperature sensor may be part of the heating element 228 or may be mounted to the heating element 228. The temperature sensor may also be mounted to the substrate 110 or one or more of the electrode pixels 114 and 116. The temperature sensor beneficially allows the temperature of the heating element 228, the substrate 110, and/or the electrode pixels 114 and 116 to be regulated by controlling power to the heating element 228.

In some embodiments, a controller, such as the controller 104 discussed in relation to FIGS. 1B and 7, is configured to control the heating element 228. For example, the controller may be configured to energize the heating element 228 and configured to regulate a temperature of the dielectric layer 222 by energizing, via the controller, at least one heating element 228 configured to heat the dielectric layer 222. The heating element 228 may require less voltage or power than the plurality of electrode pixels 112. In some embodiments, the temperature sensor may interface with the controller to regulate the temperature of the dielectric layer 222. For example, the system controller may regulate the temperature of the dielectric layer 222 by controlling the heat outputted by the heating element 228 using data from the temperature sensor. Data from the temperature sensor can be used to form a control feedback loop, such as may be implemented by the control system of FIG. 7. In some embodiments, a plurality of heating elements 228 may be configured to heat different zones or regions of the dielectric layer 222. Each heating element of the plurality of heating elements 228 may be selectively energized via the controller. For example, each heating element may interface with a corresponding temperature sensor and the controller may independently control the heat outputted by each heating element using data from the temperature sensor. In some embodiments, the zones or regions of the dielectric layer 222 heated by the plurality of heating elements 228 may coincide with the zones or regions of the electrode pixels 114 and 116.

The pixelated pad 102 may include a flexible support layer 226 in contact with the substrate 110. The flexible support layer 226 is configured to allow the pixelated pad 102 to conform to a surface of the object to be grasped, as described above. For example, the pixelated pad 102 may be used to pick up a dry carbon fiber ply from a table or a piece of carbon fiber that is already formed. A surface of the table that the ply rests on or of the formed piece of carbon fiber may not be flat and so the ply or piece may not be flat when it is picked up. The flexible support layer 226 allows the pixelated pad 102 to flex to match a contour of the table, reducing an amount of air gaps between the pixelated pad 102 and the ply. The reduction in air gaps beneficially increases the adhesive force exerted by the pixelated pad 102. As shown, the flexible support layer 226 is attached to the second side 211B of the core layer 211 and at least partially surrounds the voltage inputs 113 and 115 and the conductive control traces 224, beneficially preventing the voltage inputs 113 and 115 and the conductive control traces 224 from contacting items external to the pixelated pad 102 during use. In some embodiments, the flexible support layer 226 may be a layer of the substrate 110. For example, the core layer 211 may comprise a flexible material and function as the flexible support layer 226.

Figure 3:
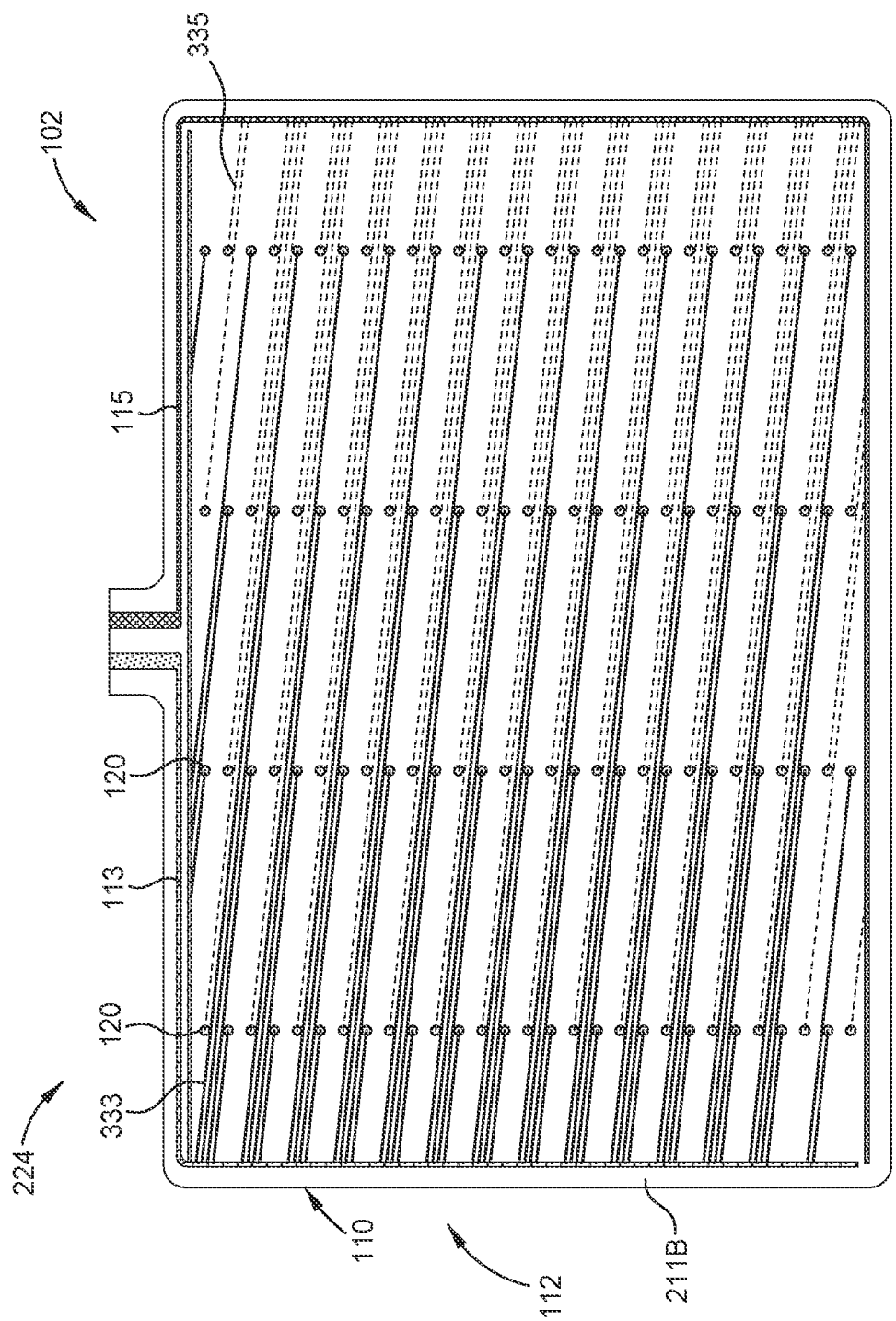
FIG. 3 depicts a wiring layout in a rear view of a pixelated electrostatic adhesion system for grasping an object, according to another example of the present disclosure.

FIG. 3 depicts a wiring diagram in a rear view of the pixelated electrostatic adhesion system 100, according to another example of the present disclosure. In particular, FIG. 3 shows an example of how the conductive control traces 224 may connect to the electrode pixels 114 and 116 of the pixelated pad 102.

As shown in FIG. 3, the voltage inputs 113 and 115 are disposed along the perimeter 130 of the plurality of electrode pixels 112. The voltage inputs 113 and 115 connect to the conductive control traces 224, which as shown include negative control traces 333 and positive control traces 335. For example, the negative voltage input 113 connects to negative control traces 333 and the positive voltage input 115 connects to the positive control traces 335. The conductive control traces 224 further connect to the plurality of electrode pixels 112 as discussed in relation to FIG. 2B. In the depicted embodiment, each of the negative electrode pixels 114 connects to a negative control trace 333 and each of the positive electrode pixels 116 connects to a positive control trace 335. The individualized connection of the conductive control traces 224 to the plurality of electrode pixels 112 allows each of the electrode pixels 114 and 116 to be energized individually. Each of the electrode pixels 114 and 116 may be configured to be energized in a range of magnitudes of voltages between 0V and 4,000V. Thus, the negative voltage input 113 may be configured to supply a voltage between −0V and −4,000V and 115 may be configured to supply a voltage between 0V and 4,000V. In some embodiments, the range of magnitudes of voltages may be between 0V and 1,500V.

As shown in FIG. 3, the conductive control traces 224 follow an interlocked layout, such as a diagonal layout. The interlocked layout beneficially allows the conductive control traces 224 to be arranged on a single layer and to connect to each of the plurality of electrode pixels 112 without overlapping or interfering with other conductive control traces. For example, the interlocked layout of the negative and positive control traces 333 and 335, respectively, allows each of the control traces 333 and 335 to be arranged on the second side 211B of the core layer 211 and connect to each of the electrode pixels 114 and 116, respectively, while maintaining a minimum separation distance from the other conductive control traces. In some embodiments, a layout or pattern other than a diagonal layout may be used for the conductive control traces 224, such as freeform or curved shapes.

In some embodiments, the conductive control traces 224 may be wires. In some embodiments, the conductive control traces 224 may be tracks or circuit traces of a printed circuit board as previously discussed in relation to FIG. 2B. In some embodiments, the conductive control traces 224 may comprise several layers of the substrate 110 as previously discussed in relation to FIG. 2B, which beneficially allows the conductive control traces 224 to connect to the electrode pixels 112 without overlapping or interfering with other conductive control traces. In some embodiments, the control traces 333 and 335 may connect to different zones or regions of electrode pixels 114 and 116 instead of individual electrode pixels.

Although the voltage inputs 113 and 115 are each shown as a single line, the voltage inputs 113 and 115 may each comprise a plurality of wires or circuit traces. For example, there may be one negative voltage input 113 for each negative control trace 333 and one positive voltage input 115 for each positive control trace 335.

Figure 4A:
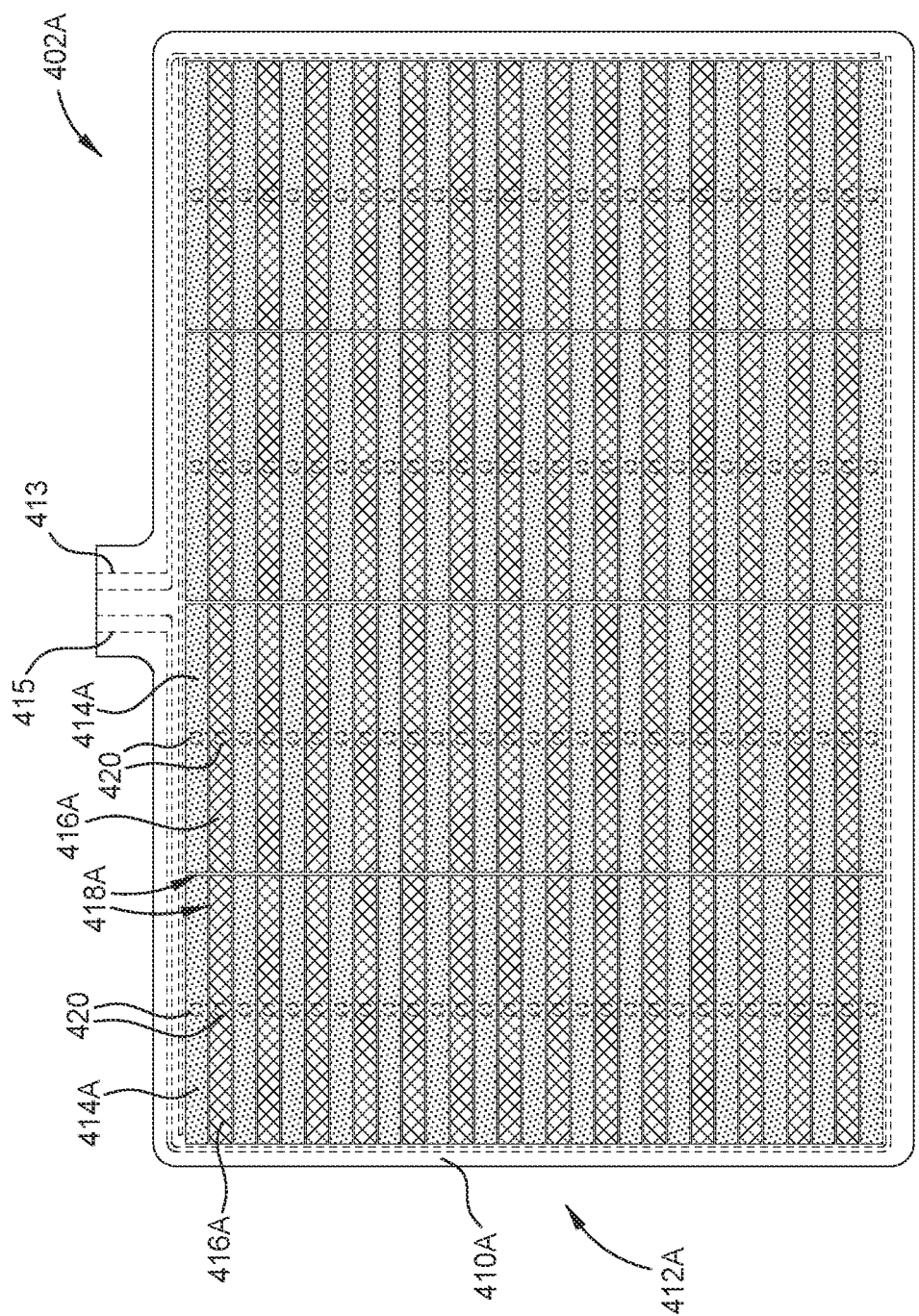
FIGS. 4A-4C depict different pixelated electrostatic adhesion systems for grasping an object, according to an example of the present disclosure.

In some embodiments, the voltage inputs 113 and 115 may each comprise a single wire or circuit trace. For example, a controller, a power distribution module, in-line switching elements, or a distribution board (collectively referred to as a control trace power supply) may be disposed in between the voltage inputs 113 and 115 and the conductive control traces 224. The control trace power supply may be configured to selectively energize each conductive control trace of the conductive control traces 224, and thus selectively energize one or more of the electrode pixels 114 and 116 connected to each conductive control trace 224. The control trace power supply may further be configured to energize each electrode pixel of the plurality of electrode pixels 112 with a range of magnitudes of voltages between 0V and 4,000V. In some embodiments, each electrode pixel of the plurality of electrode pixels 112 may be independently energized to a different voltage than other electrode pixels in the plurality of electrode pixels 112. In some embodiments, the controller 104, as discussed in relation to FIG. 1, may include the control trace power supply, and thus the controller 104 is configured to selectively energize each conductive control trace of the conductive control traces 224. For example, the controller 104 may energize each conductive control trace of the conductive control traces 224 with a positive or negative voltage, and may change between positive and negative voltages as needed. Thus, the configuration of the electrode pixels 114 and 116 may be reconfigured on-demand to be different than shown in FIGS. 1B-3, such as shown in FIG. 4A.

In some embodiments, the voltage inputs 113 and 115 may be configured differently. For example, the voltage inputs 113 and 115 may not be disposed along the perimeter 130 and may be inside the perimeter 130. In some embodiments, the voltage inputs 113 and 115 may be located on the first side 211A of the core layer 211. For example, the voltage inputs 113 and 115 may connect to each of the control traces 333 and 335 through vias (not shown).

The discussion in relation to FIGS. 1B-3 present different embodiments of the system 100 and the pixelated pad 102. In some embodiments, such as discussed in relation to FIGS. 4A-4C, different pixelated pads may be used with the system 100 or similar pixelated electrostatic adhesion systems.

Examples of Different Pixelated Pads

Figure 4B:
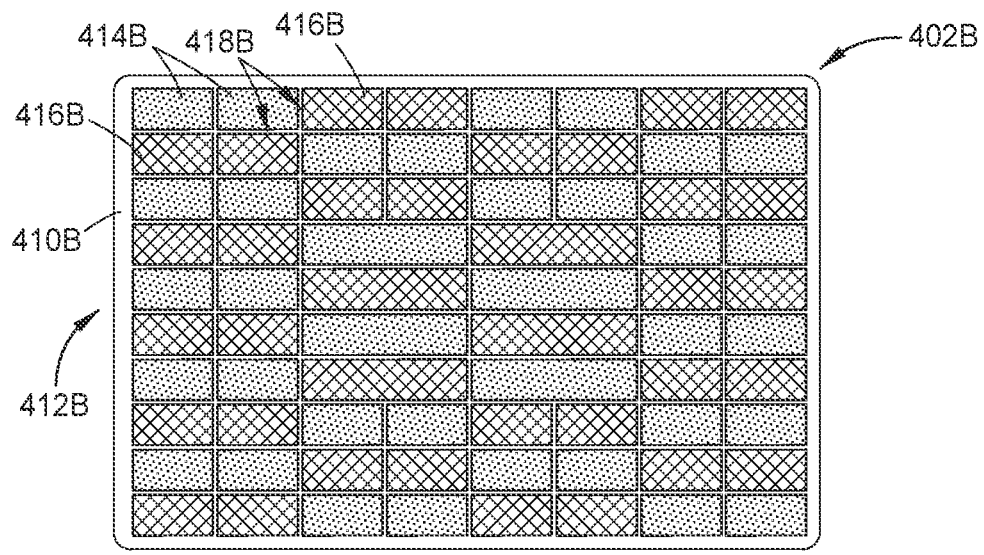
Figure 4C:
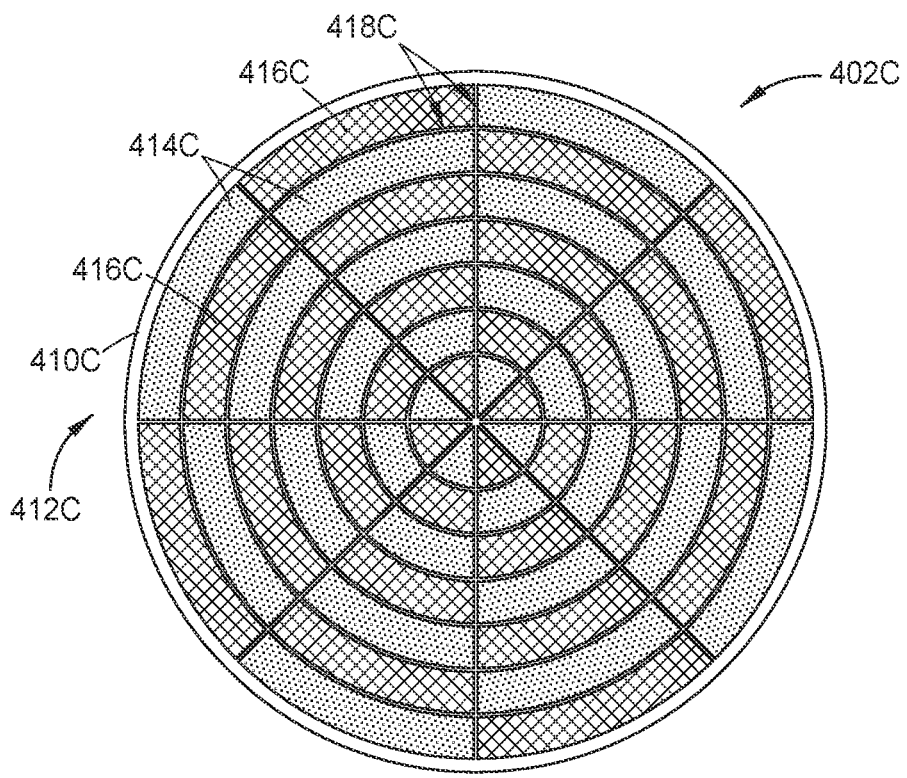

FIGS. 4A-4C depict different pixelated electrostatic adhesion systems for grasping an object, according to an example of the present disclosure. In particular, FIGS. 4A-4C show examples of different electrode layouts of different pixelated pads 402.

FIG. 4A depicts a different pixelated pad 402A for grasping an object, according to an example of the present disclosure. In particular, the pixelated pad 402A shown in FIG. 4A is an improved version of the comb-like electrode layout of the conventional systems discussed in relation to FIG. 1A.

The pixelated pad 402A includes a substrate 410A, which further includes a plurality of electrode pixels 412A. The plurality of electrode pixels 412A are arranged in a grid pattern such that each respective electrode pixel of the plurality of electrode pixels 412A is adjacent to at least two other electrode pixels of the plurality of electrode pixels 412A. A plurality of gaps 418A separates each electrode pixel of the plurality of electrode pixels 412A. In the depicted embodiment, the plurality of electrode pixels 412A includes a plurality of negative electrode pixels 414A (two of which are labeled) and a plurality of positive electrode pixels 416A (two of which are labeled). The negative and positive electrode pixels 414A and 416A, respectively, are arranged in an interdigitated pattern such that each row of the plurality of electrode pixels 412A alternates. For example, a first row may include only negative electrode pixels 414A, a second row may include only positive electrode pixels 416A, a third row may include only negative electrode pixels 414A, a fourth row may include only positive electrode pixels 416A, and so forth. Each row of the plurality of electrode pixels 412A may include more than one electrode pixel. For example, in the depicted embodiment, each row includes four electrode pixels 414A or 416A. The more than one electrode pixels per each row allows portions of each row to be energized, which beneficially allows the pixelated pad 402 to selectively grasp objects as described in relation to FIGS. 5A and 5B. For example, conventional systems, such as discussed in relation to FIG. 1A, use a conventional electroadhesive pad that non-selectively grasps all objects that contact the conventional electroadhesive pad or come within a set distance from the pad.

The negative electrode pixels 414 are connected to a negative voltage input 413 through negative control traces (not shown). Similarly, the positive electrode pixels 416 are connected to a positive voltage input 415 through positive control traces (not shown). The negative and positive control traces (referred to as conductive control traces) connect to the negative and positive electrode pixels 414 and 416, respectively, through a plurality of vias 420 (four of which are labeled) in the substrate 410 as described in relation to FIGS. 2A-3. The plurality of vias 420 are shown as dashed circles on the plurality of electrode pixels 412 to illustrate that they are hidden from view in the perspective of FIG. 4A.

In some embodiments, the negative and positive electrode pixels 414A and 416A, respectively, may reconfigured as discussed on relation to FIG. 3 such that they match the pattern of the electrode pixels 114 and 116 shown in FIG. 1B.

In some embodiments, the plurality of electrode pixels 412 may include more or fewer rows or columns. In some embodiments, each row of the plurality of electrode pixels 412 may include negative and positive electrode pixels. In some embodiments, more or fewer electrode pixels may be used per the rows.

FIG. 4B depicts a different pixelated pad 402B for grasping an object, according to an example of the present disclosure. In particular, the pixelated pad 402B shown in FIG. 4B is similar to the pixelated pad 102 of the system 100 discussed in relation to FIG. 1B, except for a layout of a plurality of electrode pixels 412B.

The pixelated pad 402B includes a substrate 410B that further includes the plurality of electrode pixels 412B. The plurality of electrode pixels 412B comprises negative electrode pixels 414B and positive electrode pixels 416B as shown in one example configuration. The negative and positive electrode pixels 414B and 416B, respectively, may reconfigured as discussed on relation to FIG. 3. A plurality of gaps 418B separate the electrode pixels 414B and 416B.

As shown in the depicted embodiment, each row may have a different amount of electrode pixels. For example, outer portions of the pixelated pad 402B may include more electrode pixels than an inner portion or a center portion. The varying amount of electrode pixels per row beneficially allows the pixelated pad 402 to selectively grasp objects with different or complex borders with finer control than a pixelated pad having a constant amount of electrode pixels per row. For example, the electrode pixels of the outer portion of the pixelated pad 402B may be selectively energized to match a shape of an object to be grasped as described in relation to FIGS. 5A and 5B.

In some embodiments, the pixelated pad 402B may further include a plurality of vias, positive and negative voltage inputs, and conductive control traces as discussed in relation to FIGS. 1B-3.

FIG. 4C depicts a different pixelated pad 402C for grasping an object, according to an example of the present disclosure. In particular, the pixelated pad 402C shown in FIG. 4C is similar to the pixelated pad 402B discussed in relation to FIG. 4B, except for a shape of a substrate 410C and a shape and a layout of a plurality of electrode pixels 412C.

Similar to the pixelated pad 402B, the pixelated pad 402C includes the substrate 410C and a plurality of electrode pixels 412C comprising negative electrode pixels 414C and positive electrode pixels 416C that are separated by a plurality of gaps 418C. The plurality of electrode pixels 412C are arranged in a circular pattern (also referred to as a target pattern) having a plurality of nested rings of electrode pixels. As shown, each respective electrode pixel of the plurality of electrode pixels 412C has an arc, arch, or semi-circular shape and is adjacent to at least two other electrode pixels of the opposite polarity. For example, the negative electrode pixel 414C is adjacent to at least two positive electrode pixels 416C. In the depicted embodiment, the electrode pixels in each ring of the circular pattern alternate between the negative electrode pixels 414C and the positive electrode pixels 416C. The electrode pixels further alternate between the negative and the positive electrode pixels 414C and 416C, respectively, in a radially outward direction from a center ring to an outer ring of the circular pattern. The electrode pixels 414C and 416C vary in shape and size. Each electrode of the plurality of electrode pixels 412C may be selectively energized, which beneficially allows the pixelated pad 402C to selectively grasp objects as described in relation to FIGS. 5A and 5B. The negative and positive electrode pixels 414C and 416C, respectively, may reconfigured as discussed on relation to FIG. 3.

In some embodiments, each ring of the circular pattern contains only negative electrode pixels 414C or only positive electrode pixels 416C. In some embodiments, the plurality of electrode pixels 412C may be arranged in a spiral pattern. In some embodiments, the circular pattern may be considered a grid pattern.

In some embodiments, the pixelated pad 402C may further include a plurality of vias, positive and negative voltage inputs, and conductive control traces as discussed in relation to FIG. 4A.

FIGS. 4A-4C present different embodiments of a pixelated pad. For example, the pixelated pads 402A-402C each differ from the pixelated pad 102 previously discussed in relation to FIGS. 1B-3. In some embodiments, each of the pixelated pads 402A-402C may be used with the system 100 described in relation to FIG. 1B. As previously discussed, a subset of electrode pixels of the pixelated pad 102 or 402A-402C may be energized to selectively grasp an object, such as further discussed in relation to FIGS. 5A and 5B.

Examples of Selectively Grasping an Object Using a Pixelated Pad

Figure 5A:
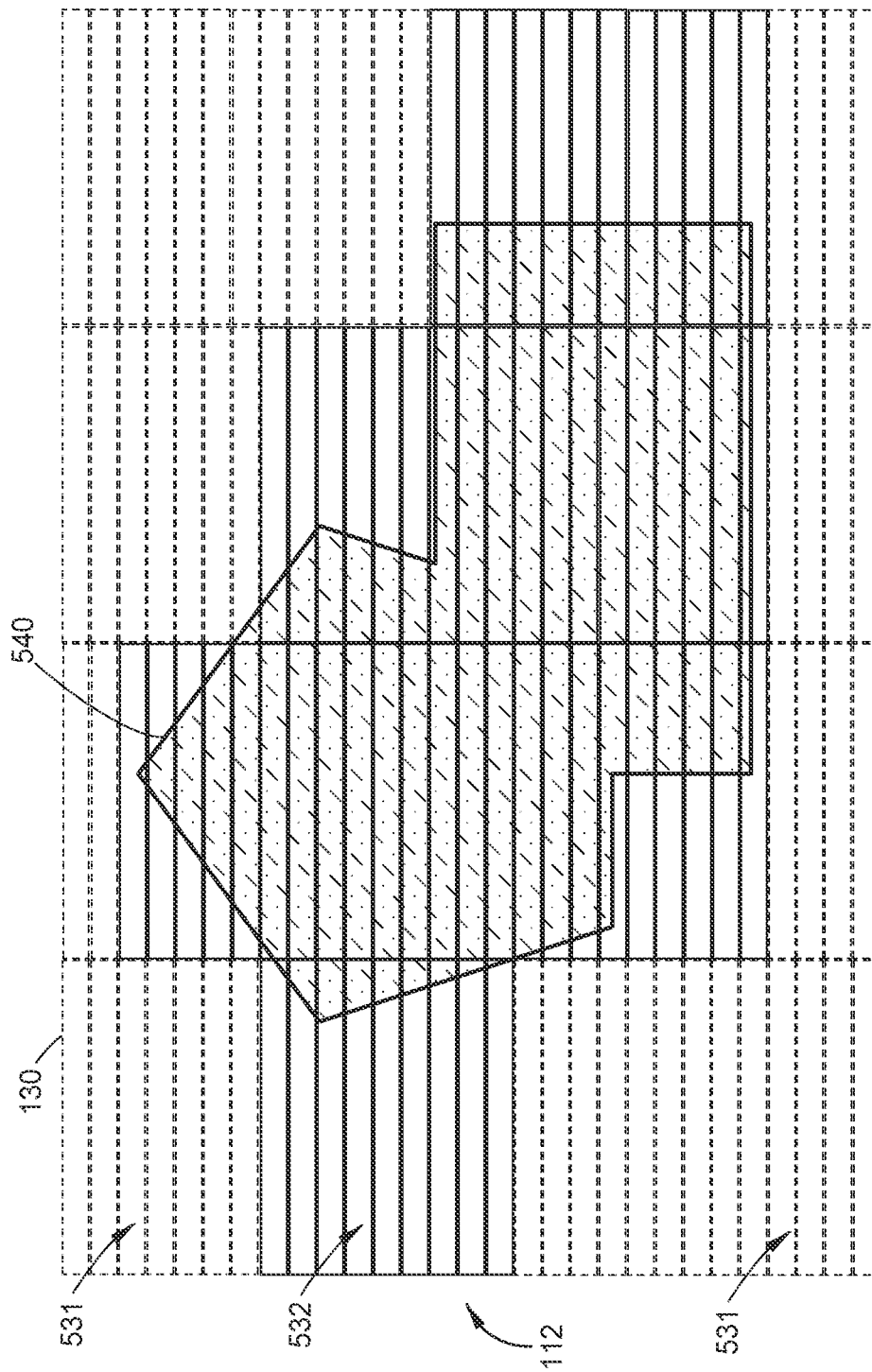

FIGS. 5A and 5B depict a subset of electrode pixels 532 configured to grasp different objects, according to an example of the present disclosure. In particular, FIGS. 5A and 5B show how one or more subsets (e.g., the subset of electrode pixels 532) of the plurality of electrode pixels 112 may be energized to selectively grasp (referred to as pick up) different objects. The views of FIGS. 5A and 5B are schematic in nature and not meant to be a perspective view of the pixelated pad (e.g., the pixelated pad 102 or 402A). For illustrative purposes, the hatching is used to identify objects, some of which may be picked up. The subset of electrode pixels 532 subset of the plurality of electrode pixels 112 are shown as solid lines while the remaining electrode pixels (e.g., non-energized electrode pixels 531) of the plurality of electrode pixels 112 are shown as dashed lines. For example, when an object is grasped, the subset of electrode pixels 532 are energized and the non-energized electrode pixels 531 are not energized.

As shown in FIG. 5A, the plurality of electrode pixels 112 are bounded by the perimeter 130. When used to pick up an object 540, the plurality of electrode pixels 112 are placed over the object 540 such that the object 540 is contained within the perimeter 130 when viewed from above as shown in FIG. 5A. In the depicted embodiment, only the electrode pixels that are over the object 540 are energized. For example, each electrode pixel of the subset of electrode pixels 532 is over at least a portion of the object 540. Energizing only the subset of electrode pixels 532 beneficially allows the plurality of electrode pixels 112 to securely pick up the object 540 using fewer electrode pixels and less energy than conventional systems, while ensuring an edge of the object 540 does not fold over or become damaged.

A controller (e.g., the controller 104 in FIGS. 1B and 7) may be provided instructions to energize a subset of electrode pixels of the plurality of electrode pixels (e.g., the subset of electrode pixels 532 and the electrode pixels 112). The subset of electrode pixels 532 may be based on the shape of the object 540 to be grasped. In some embodiments, the controller may be configured to determine a shape of the object 540 and to energize a subset of electrode pixels 532 of the plurality of electrode pixels based on the shape of the object 540. For example, a distance measurement system (e.g., the distance measurement system 108 in FIGS. 1B and 7) may determine a position and orientation of the object 540 in relation to the plurality of electrode pixels 112. The controller may interface with the distance measurement system to determine the shape and orientation of the object 540. The controller may determine a subset of electrode pixels (e.g., the subset of electrode pixels 532) to energize based on the shape and orientation of the object 540. In some embodiments, the controller determines a subset of electrode pixels with the fewest amount of electrode pixels over the object 540. In some embodiments, the controller determines a subset of electrode pixels (e.g., a first subset of electrode pixels 532A in FIG. 5B) with the most amount of electrode pixels that do not extend past a perimeter of an object (e.g. a first object 542 in FIG. 5B). In some embodiments, the controller determines a subset of electrode pixels that satisfies a power or adhesion threshold. The controller may further control a motion system (e.g., the motion system 106 in FIGS. 1B and 7) to position and orient the determined subset of electrode pixels (e.g., the subset of electrode pixels 532) above the object 540.

As shown in FIG. 5B, the plurality of electrode pixels 112 may include multiple subsets of electrode pixels 532. For example, the plurality of electrode pixels 112 includes a first subset of electrode pixels 532A and a second subset of electrode pixels 532B. Each subset may correspond to an object to be picked up. In the depicted embodiment, the first subset of electrode pixels 532A picks up a first object 542 and the second subset of electrode pixels 532B picks up a second object 546.

The first object 542 is a portion cut from a ply sheet 543. The remaining portion of the ply sheet 543 is a scrap material skeleton 544. The first subset of electrode pixels 532A is aligned to the first object 542 such that each electrode pixel of the first subset of electrode pixels 532A is contained within a perimeter of the first object 542. When energized, the first subset of electrode pixels 532A picks up the first object 542 and not the scrap material skeleton 544. Thus, the first subset of electrode pixels 532A selectively picks up the first object 542 while leaving behind the scrap material skeleton 544.

The second object 546 is positioned near a third object 548. The second subset of electrode pixels 532B is aligned such that each electrode pixel of the second subset of electrode pixels 532B is over at least a portion of the second object 546, but none of the electrode pixels are over the third object 548. For example, an electrode pixel 539 that is not energized is over the second object 546 and the third object 548. Although the electrode pixel 539 is over the second object 546, the second subset of electrode pixels 532B does not include the electrode pixel 539. Thus, when energized the second subset of electrode pixels 532B selectively picks up the second object 546 while leaving behind the third object 548.

Examples of Methods for Grasping an Object Using a Pixelated Pad

Figure 6:
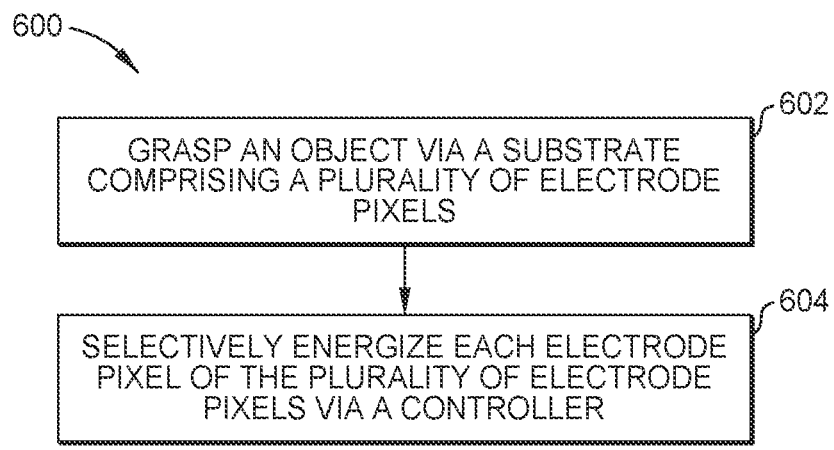
FIG. 6 depicts an example method for grasping an object electrostatically according to the systems and methods described herein.

FIG. 6 depicts an example method 600 for grasping an object electrostatically, according to another example of the present disclosure.

Method 600 begins at step 602 with grasping an object via a substrate comprising a plurality of electrode pixels, as described above with respect to FIGS. 1B-5B.

Method 600 then proceeds to step 604 with selectively energizing each electrode pixel of the plurality of electrode pixels via a controller, as described above with respect to FIGS. 1B-5B.

In some embodiments of method 600, each respective electrode pixel of the plurality of electrode pixels is adjacent to at least two other electrode pixels of the plurality of electrode pixels having a polarity opposite the respective electrode pixel, as described above with respect to FIGS. 1B and 4A.

In some embodiments of method 600, the plurality of electrode pixels is arranged in a grid pattern of alternating polarities among adjacent electrode pixels, as described above with respect to FIGS. 1B and 4A.

In some embodiments of method 600, each electrode pixel of the plurality of electrode pixels is approximately 5 mm×50 mm in size, as described above with respect to FIG. 2A.

In some embodiments of method 600, each electrode pixel of the plurality of electrode pixels is separate from any adjacent electrode pixel of the plurality of electrode pixels by no more than approximately 2 mm, as described above with respect to FIGS. 2A.

In some embodiments of method 600, the plurality of electrode pixels are arranged on a first side of the substrate and a plurality of conductive control traces are arranged on a second side of the substrate, as described above with respect to FIGS. 2A and 2B. Each electrode pixel of the plurality of electrode pixels is connected to one conductive control trace of the plurality of conductive control traces by a via in the substrate. The controller is configured to selectively energize each conductive control trace of the plurality of conductive control traces.

In some embodiments of method 600, a dielectric layer is disposed over the plurality of electrode pixels, as described above with respect to FIG. 2B.

In some embodiments of method 600, the substrate is flexible, as described above with respect to FIG. 1B. In some embodiments, the substrate is in contact with a flexible support layer, as described above with respect to FIG. 2B.

In some embodiments of method 600, the plurality of electrode pixels comprises a square or rectangular perimeter, as described above with respect to FIGS. 1B, 4B, and 4C.

Some embodiments of method 600 further include determining a shape of the object and energizing, via the controller, a subset of electrode pixels of the plurality of electrode pixels based on the shape of the object, as described above with respect to FIGS. 1B, 4B, 5A, and 5B.

In some embodiments of method 600, the subset of electrode pixels is based on a perimeter of the shape of the object, as described above with respect to FIGS. 5A and 5B.

Some embodiments of method 600 further include positioning the substrate adjacent to the object via a motion system, as described above with respect to FIGS. 1B and 5A-5B.

Some embodiments of method 600 further include positioning the substrate based on a distance measurement between the substrate and the object, as described above with respect to FIGS. 1B and 5A-5B.

In some embodiments of method 600, each electrode pixel of the plurality of electrode pixels is configured to be energized in a range of voltages between 0V and 4,000V, as described above with respect to FIGS. 2B and 3.

Some embodiments of method 600 further include energizing, via the controller, at least one heating element configured to heat the substrate, as described above with respect to FIG. 2B.

Example Processing System

FIG. 7 depicts a schematic view of an example system controller 104 (also referred to as the controller 104) that can be used according to the systems and methods described herein. The system controller 104 includes a processor 760 (e.g., a central processing unit (CPU)) in data communication with a memory 750, an input device 770, and an output device 780. Although described separately, it is to be appreciated that functional blocks described with respect to the system controller 104 need not be separate structural elements. For example, the processor 760 and memory 750 is embodied in a single chip. The processor 760 can be a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 760 can be coupled, via one or more buses, to read information from or write information to memory 750. The processor may additionally, or in the alternative, contain memory, such as processor registers. The memory 750 can include processor cache, including a multi-level hierarchical cache in which different levels have different capacities and access speeds. The memory 750 can also include random access memory (RAM), other volatile storage devices, or non-volatile storage devices. The storage can include hard drives, flash memory, etc. Memory 750 can also include a computer program product embodied on memory 750 comprising code such as a motion system control application 756 that is used to control a position and orientation of the pixelated pad as discussed in relation to FIGS. 1B and 5A-5B, a voltage control application 754 that is used to control the voltage inputs as discussed in relation to FIG. 2B and 3, or a heating control application 758 that is used to control voltage or power to a heating element as discussed in relation to FIG. 2B. Control applications 754, 756, and 758 may be code that can be executed by processor 760. In various instances, the memory is referred to as a computer-readable storage medium or a non-transitory computer-readable medium. The computer-readable storage medium is a non-transitory device capable of storing information, and is distinguishable from computer-readable transmission media such as electronic transitory signals capable of carrying information from one location to another. The non-transitory computer readable medium includes computer-executable instructions that, when executed by a processing system, cause the processing system to perform a method, as described in relation to FIGS. 1B and 2A-5B, including grasping an object via a substrate comprising a plurality of electrode pixels, and selectively energizing each electrode pixel of the plurality of electrode pixels via a controller. In some embodiments, the method performed by the processing system includes determining a shape of the object and energizing, via the controller, a subset of electrode pixels of the plurality of electrode pixels based on the shape of the object. In some embodiments, the method performed by the processing system includes positioning the substrate adjacent to the object via a motion system. In some embodiments, the method performed by the processing system includes positioning the substrate based on a distance measurement between the substrate and the object. In some embodiments, the method performed by the processing system includes energizing, via the controller, at least one heating element configured to heat the substrate. Computer-readable medium as described herein may generally refer to a computer-readable storage medium or computer-readable transmission medium.

The processor 760 also may be coupled to an input device 770 and an output device 780 for, respectively, receiving input from and providing output to the system controller 104. Input devices 770 may be part of a distance measurement system 108 or may be a substrate temperature sensor 778. Suitable input devices from the distance measurement system 108 include, but are not limited to a video camera (possibly coupled with video processing software to, e.g., detect a position of a pixelated pad (e.g., the pixelated pad 102 in FIG. 1B) or of an object to be grasped by the pixelated pad, an encoder (e.g., an optical or magnetic, capacitive, or inductive encoder), a resolver, a potentiometer, an angle sensor, an accelerometer, a gyroscope, an inertial measurement unii, a global positioning system, or a motion detector and the like. For example, the input device 770 may include a position sensor such as an encoder or angle position sensor as discussed in relation to FIG. 1B. The substrate temperature sensor 778 may be at least one of a thermocouple, resistance temperature detector, thermistor, or a semiconductor based integrated circuit. Suitable output devices include, but are not limited to, the motion system 106 as discussed in relation to FIGS. 1B and 5A-5B, the plurality of electrode pixels 112 as discussed in relation to 1B and 2A-5B, and the heating element 228 as discussed in relation to FIG. 2B.

Aspects of the present disclosure have been described above with reference to specific embodiments. Persons skilled in the art, however, will understand that various modifications and changes may be made thereto without departing from the broader spirit and scope of the present disclosure as set forth in the appended claims. The foregoing description and drawings are, accordingly, to be regarded in an illustrative rather than a restrictive sense.

Example Clauses

Implementation examples are described in the following numbered clauses:

Clause 1. An apparatus for grasping an object, comprising a substrate comprising a plurality of electrode pixels; and a controller configured to energize each electrode pixel of the plurality of electrode pixels individually, wherein the apparatus is configured to grasp an object electrostatically using the substrate.

Clause 2. The apparatus of Clause 1, wherein each respective electrode pixel of the plurality of electrode pixels is adjacent to at least two other electrode pixels of the plurality of electrode pixels having a polarity opposite the respective electrode pixel.

Clause 3. The apparatus of any one of Clauses 1-2, wherein the plurality of electrode pixels is arranged in a grid pattern of alternating polarities among adjacent electrode pixels.

Clause 4. The apparatus of any one of Clauses 1-3, wherein each electrode pixel of the plurality of electrode pixels is approximately 5 mm×50 mm in size.

Clause 5. The apparatus of any one of Clauses 1-4, wherein each electrode pixel of the plurality of electrode pixels is separated from any adjacent electrode pixel of the plurality of electrode pixels by no more than approximately 2 mm.

Clause 6. The apparatus of any one of Clauses 1-5, wherein the controller is configured to energize each electrode pixel of the plurality of electrode pixels individually.

Clause 7. The apparatus of Clause 6, wherein the plurality of electrode pixels are arranged on a first side of the substrate, a plurality of conductive control traces are arranged on a second side of the substrate, each electrode pixel of the plurality of electrode pixels is connected to one conductive control trace of the plurality of conductive control traces by a via in the substrate, and the controller is configured to selectively energize each conductive control trace of the plurality of conductive control traces.

Clause 8. The apparatus of any one of Clauses 1-7, further comprising a dielectric layer disposed over the plurality of electrode pixels.

Clause 9. The apparatus of Clause 8, further comprising at least one heating element configured to heat the dielectric layer, wherein the controller is further configured to energize the at least one heating element and configured to control a temperature of the dielectric layer.

Clause 10. The apparatus of any one of Clauses 1-9, wherein the substrate is flexible.

Clause 11. The apparatus of Clause 10, further comprising a flexible support layer in contact with the substrate.

Clause 12. The apparatus of any one of Clauses 1-11, wherein the plurality of electrode pixels comprises a square or rectangular perimeter.

Clause 13. The apparatus of any one of Clauses 1-12, wherein the controller is further configured to determine a shape of the object to be grasped electrostatically; and energize a subset of electrode pixels of the plurality of electrode pixels based on the shape of the object.

Clause 14. The apparatus of Clause 13, wherein the subset of electrode pixels is based on a perimeter of the shape of the object.

Clause 15. The apparatus of any one of Clauses 1-14, further comprising a motion system configured to position the substrate adjacent to the object to be grasped.

Clause 16. The apparatus of any one of Clauses 1-15, further comprising a distance measurement system configured to measure a distance between the substrate and the object to be grasped.

Clause 17. The apparatus of any one of Clauses 1-16, wherein the each electrode pixel of the plurality of electrode pixels is configured to be energized in a range of voltages between 0V and 4,000V.

Clause 18. A method for grasping an object electrostatically, comprising grasping an object via a substrate comprising a plurality of electrode pixels; and selectively energizing each electrode pixel of the plurality of electrode pixels via a controller.

Clause 19. The method of Clause 18, wherein each respective electrode pixel of the plurality of electrode pixels is adjacent to at least two other electrode pixels of the plurality of electrode pixels having a polarity opposite the respective electrode pixel.

Clause 20. The method of any one of Clauses 18-19, wherein the plurality of electrode pixels is arranged in a grid pattern of alternating polarities among adjacent electrode pixels.

Clause 21. The method of any one of Clauses 18-20, wherein each electrode pixel of the plurality of electrode pixels is approximately 5 mm×50 mm in size.

Clause 22. The method of any one of Clauses 18-21, wherein each electrode pixel of the plurality of electrode pixels is separate from any adjacent electrode pixel of the plurality of electrode pixels by no more than approximately 2 mm.

Clause 23. The method of any one of Clauses 18-22, wherein the plurality of electrode pixels are arranged on a first side of the substrate, a plurality of conductive control traces are arranged on a second side of the substrate, each electrode pixel of the plurality of electrode pixels is connected to one conductive control trace of the plurality of conductive control traces by a via in the substrate, and the controller is configured to selectively energize each conductive control trace of the plurality of conductive control traces.

Clause 24. The method of any one of Clauses 18-23, wherein a dielectric layer is disposed over the plurality of electrode pixels.

Clause 25. The method of Clause 24, further comprising energizing, via the controller, at least one heating element configured to heat the dielectric layer.

Clause 26. The method of any one of Clauses 18-25, wherein the substrate is flexible.

Clause 27. The method of Clause 26, wherein the substrate is in contact with a flexible support layer.

Clause 28. The method of any one of Clauses 18-27, wherein the plurality of electrode pixels comprises a square or rectangular perimeter.

Clause 29. The method of any one of Clauses 18-28, further comprising determining a shape of the object; and energizing, via the controller, a subset of electrode pixels of the plurality of electrode pixels based on the shape of the object.

Clause 30. The method of Clause 29, wherein the subset of electrode pixels is based on a perimeter of the shape of the object.

Clause 31. The method of any one of Clauses 18-30, further comprising positioning the substrate adjacent to the object via a motion system.

Clause 32. The method of Clause 31, further comprising positioning the substrate based on a distance measurement between the substrate and the object.

Clause 33. The method of any one of Clauses 18-32, wherein the each electrode pixel of the plurality of electrode pixels is configured to be energized in a range of voltages between 0V and 4,000V.

Clause 34. The method of any one of Clauses 18-33, further comprising energizing, via the controller, at least one heating element configured to heat the substrate.

Clause 35. A processing system, comprising a memory comprising computer-executable instructions; and one or more processors configured to execute the computer-executable instructions and cause the processing system to perform a method in accordance with any one of Clauses 18-34.

Clause 36. A processing system, comprising means for performing a method in accordance with any one of Clauses 18-34.

Clause 37. A non-transitory computer-readable medium comprising computer-executable instructions that, when executed by one or more processors of a processing system, cause the processing system to perform a method in accordance with any one of Clauses 18-34.

Clause 38. A computer program product embodied on a computer-readable storage medium comprising code for performing a method in accordance with any one of Clauses 18-34.

Additional Considerations

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus for grasping an object, comprising:
a substrate comprising a plurality of electrode pixels;
a dielectric layer disposed over the plurality of electrode pixels;
at least one heating element; and
a controller configured to:
energize each electrode pixel of the plurality of electrode pixels individually;
energize the at least one heating element to control a temperature of the dielectric layer; and
selectively energize, based on a shape of an object, a subset of the plurality of electrode pixels to electrostatically grasp the object using the substrate.

2. The apparatus of claim 1, wherein each respective electrode pixel of the plurality of electrode pixels is adjacent to at least two other electrode pixels of the plurality of electrode pixels having a polarity opposite the respective electrode pixel.

3. The apparatus of claim 1, wherein the plurality of electrode pixels is arranged in a grid pattern of alternating polarities among adjacent electrode pixels.

4. The apparatus of claim 1, wherein:
the plurality of electrode pixels are arranged on a first side of the substrate,
a plurality of conductive control traces are arranged on a second side of the substrate,
each electrode pixel of the plurality of electrode pixels is connected to one conductive control trace of the plurality of conductive control traces by a via in the substrate, and
the controller is configured to selectively energize each conductive control trace of the plurality of conductive control traces.

5. The apparatus of claim 1, wherein the plurality of electrode pixels comprises a square or rectangular perimeter.

6. The apparatus of claim 1, wherein the controller is further configured to:
determine the shape of the object to be grasped electrostatically.

7. The apparatus of claim 6, wherein the subset of the plurality of electrode pixels is based on a perimeter of the shape of the object.

8. An apparatus for grasping an object, comprising:
a substrate comprising a plurality of electrode pixels;
a motion system configured to position the substrate adjacent to the object to be grasped;
a distance measurement system configured to measure a distance between the substrate and the object to be grasped; and
a controller configured to:
energize each electrode pixel of the plurality of electrode pixels individually; and
selectively energize, based on a shape of an object, a subset of the plurality of electrode pixels to electrostatically grasp the object using the substrate.

9. A method for grasping an object electrostatically, comprising:
energizing, using a controller, at least one heating element to heat a dielectric layer disposed over a plurality of electrode pixels of a substrate; and
selectively energizing, based on a shape of the object, only a subset of the plurality of electrode pixels to electrostatically grasp the object using the substrate.

10. The method of claim 9, wherein each respective electrode pixel of the plurality of electrode pixels is adjacent to at least two other electrode pixels of the plurality of electrode pixels having a polarity opposite the respective electrode pixel.

11. The method of claim 9, wherein the plurality of electrode pixels is arranged in a grid pattern of alternating polarities among adjacent electrode pixels.

12. The method of claim 9, wherein:
the plurality of electrode pixels are arranged on a first side of the substrate,
a plurality of conductive control traces are arranged on a second side of the substrate,
each electrode pixel of the plurality of electrode pixels is connected to one conductive control trace of the plurality of conductive control traces by a via in the substrate, and
the controller is configured to selectively energize each conductive control trace of the plurality of conductive control traces.

13. The method of claim 9, further comprising:
determining the shape of the object.

14. The method of claim 13, wherein the subset of the plurality of electrode pixels is based on a perimeter of the shape of the object.

15. The method of claim 9, further comprising:
positioning the substrate adjacent to the object via a motion system; and
positioning the substrate based on a distance measurement between the substrate and the object.

* * * * *

UNITED STATES PATENT AND TRADEMARK OFFICE
CERTIFICATE OF CORRECTION

PATENT NO. : 11,936,308 B2
APPLICATION NO. : 17/544512
DATED : March 19, 2024
INVENTOR(S) : David M. Bain et al.

It is certified that error appears in the above-identified patent and that said Letters Patent is hereby corrected as shown below:

In the Claims

In Column 24, Line 30, in Claim 9, before "a subset" delete "only".

Signed and Sealed this
Third Day of September, 2024

Katherine Kelly Vidal
*Director of the United States Patent and Trademark Office*